United States Patent
Goto et al.

(10) Patent No.: US 7,718,925 B2
(45) Date of Patent: May 18, 2010

(54) SUBSTRATE HEAT TREATMENT APPARATUS

(75) Inventors: Shigehiro Goto, Kyoto (JP); Keiji Matsuchika, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 649 days.

(21) Appl. No.: 11/566,507

(22) Filed: Dec. 4, 2006

(65) Prior Publication Data

US 2007/0128889 A1 Jun. 7, 2007

(30) Foreign Application Priority Data

Dec. 6, 2005 (JP) ............... 2005-351941

(51) Int. Cl.
*H01L 21/68* (2006.01)
*H05B 3/22* (2006.01)

(52) U.S. Cl. ............. 219/390; 219/444.1; 118/724; 118/728

(58) Field of Classification Search ............ None
See application file for complete search history.

(56) References Cited

U.S. PATENT DOCUMENTS

| | | | |
|---|---|---|---|
| 6,129,546 A * | 10/2000 | Sada | 432/253 |
| 6,394,797 B1 | 5/2002 | Sugaya et al. | |
| 6,544,338 B1 * | 4/2003 | Batchelder et al. | 118/724 |
| 6,786,974 B2 * | 9/2004 | Komiya et al. | 118/719 |

FOREIGN PATENT DOCUMENTS

| | | | |
|---|---|---|---|
| JP | 2-290013 | | 11/1990 |
| JP | 6-79140 | | 11/1994 |
| JP | 10-284360 | | 10/1998 |
| JP | 11329925 A | * | 11/1999 |
| JP | 2003-168643 | | 6/2003 |
| JP | 2004241702 A | * | 8/2004 |

OTHER PUBLICATIONS

Office Action issued Oct. 15, 2009 in related U.S. Appl. No. 11/566,442, which includes, at pp. 2-4, a nonstatutory obviousness-type double patenting rejection over certain claims of the present application.

* cited by examiner

*Primary Examiner*—Joseph M Pelham
(74) *Attorney, Agent, or Firm*—Ostrolenk Faber LLP (57) ABSTRACT

A heat-treating plate has, arranged on the upper surface thereof, support elements for supporting a substrate, and a first sealer for closing lateral areas of a first space formed between the heat-treating plate and the substrate supported. Further, second sealers ring-shaped in plan view are arranged around openings of perforations accommodating transfer pins. The second sealers close lateral areas of second spaces opposed to the perforations. Gastightness of the first space excluding the second spaces is never impaired through the perforations. By exhausting gas from the first space through exhaust bores, the substrate is effectively sucked for heat treatment.

20 Claims, 9 Drawing Sheets

SUBSTRATE HEAT TREATMENT APPARATUS

BACKGROUND OF THE INVENTION (1) Field of the Invention

This invention relates to a substrate heat treatment apparatus for heat-treating substrates such as semiconductor wafers, glass substrates for liquid crystal displays, glass substrates for photomasks and substrates for optical disks (hereinafter simply called "substrates"). More particularly, the invention relates to a technique for heat-treating a substrate as sucked in a position slightly spaced from a heat-treating plate.

(2) Description of the Related Art

With an increasingly fine line width of patterns formed on substrates today, the requirements for line width uniformity have become stringent, which has led to a strong demand for temperature uniformity in baking treatment in photolithography, especially in baking treatment after exposure (PEB: Post Exposure Bake). However, with enlarged substrate sizes, increased curvatures of substrates take place in the semiconductor manufacturing process. It is difficult to satisfy the requirements for temperature uniformity in a proximity heating mode that heats each substrate only by placing the substrate as separated by a minute space from a heat-treating plate.

Thus, a suction bake mode has been proposed in order to perform uniform heat treatment even for curved substrates. This type of apparatus includes a heat-treating plate with a heater, support elements and a sealer arranged on the upper surface of the heat-treating plate, exhaust bores for exhausting gas, and perforations for receiving transfer pins (as disclosed in Japanese Unexamined Patent Publication H10-284360 (1998), for example). As the transfer pins are driven up and down to transfer a substrate introduced into the apparatus to the support elements, the sealer as well as the support elements contacts the substrate. The sealer then closes lateral areas of a space formed between the substrate and heat-treating plate. The substrate is sucked by exhausting gas through the exhaust bores. By sucking the substrate in this way, any curvature of the substrate is corrected whereby the substrate is heated uniformly.

The conventional apparatus noted above has the following drawback.

The perforations are in communication with the space formed between the substrate and heat-treating plate and closed by the sealer. Since the transfer pins move up and down inside these perforations, it is difficult to seal the space and its gastightness can be lost. In this case, the pressure in the space does not become a negative pressure even when gas is exhausted through the exhaust bores, thereby failing to suck the substrate and correct the curvature. As a result, the substrate cannot be heat-treated properly.

SUMMARY OF THE INVENTION

This invention has been made having regard to the state of the art noted above, and its object is to provide a substrate heat treatment apparatus capable of effectively sucking a substrate without impairing gastightness of a space formed between a substrate and a heat-treating plate, through perforations with transfer pins vertically movably arranged therein.

The above object is fulfilled, according to this invention, by a substrate heat treatment apparatus for heat-treating a substrate, comprising a heat-treating plate; transfer pins mounted in perforations extending vertically through the heat-treating plate for contacting and supporting the substrate; support devices projecting from an upper surface of the heat-treating plate for contacting and supporting the substrate; a lift device for vertically moving the transfer pins between a transfer position above a projecting height of the support devices and a standby position level with or below the projecting height of the support devices; a first closing device disposed annularly on the upper surface of the heat-treating plate for closing lateral areas of a first space formed between the substrate supported by the support devices and the heat-treating plate; second closing devices disposed annularly on the upper surface of the heat-treating plate, around openings of the perforations, and in positions inward of the first closing device, for closing lateral areas of second spaces formed between the substrate supported by the support devices and the heat-treating plate, and opposed to the perforations; and exhaust bores for exhausting gas from the first space excluding the second spaces.

According to this invention, the first space formed between the substrate and heat-treating plate and closed by the first closing device includes second closing devices partitioning and closing second spaces communicating with the perforations. Since the first space is isolated from the second spaces, gastightness of the first space is never impaired through the perforations. Thus, the substrate is effectively sucked for heat treatment.

In the above apparatus, the second closing devices may have elastic elements. The second closing devices, while being deformed, are placed in contact with the substrate. The elastic restoring force of the second closing devices produces a contact pressure on the surfaces thereof contacting the substrate, which improves the sealing performance of the second closing devices. The second closing devices per se may be elastic, or part thereof may be elastic.

In another aspect of the invention, a substrate heat treatment apparatus for heat-treating a substrate comprises a heat-treating plate; transfer pins mounted in perforations extending vertically through the heat-treating plate for contacting and supporting the substrate; support devices projecting from an upper surface of the heat-treating plate for contacting and supporting the substrate; a lift device for vertically moving the transfer pins between a transfer position above a projecting height of the support devices and a standby position level with or below the projecting height of the support devices; a closing device disposed annularly on the upper surface of the heat-treating plate for closing lateral areas of a space formed between the substrate supported by the support devices and the heat-treating plate; exhaust bores for exhausting gas from the space excluding the second spaces; and ring-shaped slide contact elements provided for the perforations and in sliding contact with the transfer pins for applying shaft seals thereto.

According to this invention, the slide contact elements properly apply shaft seals to the transfer pins vertically movable inside the perforations. Consequently, gastightness of the space formed between the substrate and heat-treating plate and closed by the closing device is never impaired through the perforations. The substrate is effectively sucked for heat treatment.

In the above apparatus, the slide contact elements may be arranged around openings of the perforations formed in a lower surface of the heat-treating plate. With the slide contact elements arranged in the positions as remote from the substrate as possible, particles generating from the slide contact elements will not influence the substrate.

In a further aspect of the invention, a substrate heat treatment apparatus for heat-treating a substrate comprises a heat-treating plate; transfer pins mounted in perforations extending vertically through the heat-treating plate for contacting and supporting the substrate; support devices projecting from an upper surface of the heat-treating plate for contacting and supporting the substrate; a lift device for vertically moving the transfer pins between a transfer position above a projecting height of the support devices and a standby position level with or below the projecting height of the support devices; a closing device disposed annularly on the upper surface of the heat-treating plate for closing lateral areas of a space formed between the substrate supported by the support devices and the heat-treating plate; exhaust bores for exhausting gas from the space excluding the second spaces; and flexion elements joined to positions on a lower surface of the heat-treating plate and surrounding openings of the perforations, and defining closed spaces communicating with the perforations, the flexion elements being expandable and contractible with vertical movement of the transfer pins.

According to this invention, the flexion elements can form closed spaces communicating with the perforations even when the transfer pins move up and down inside the perforations. Consequently, gastightness of the space formed between the substrate and heat-treating plate and closed by the closing device is never impaired through the perforations. The substrate is effectively sucked for heat treatment.

In the above apparatus, the transfer pins and the lift device may be connected to each other through a support base, and the flexion elements may surround the transfer pins and may be joined to the support base. Then, the closed spaces communicating with the perforations are realized easily and properly.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Embodiment 1

Embodiment 1 of this invention will be described hereinafter with reference to the drawings.

Figure 1:
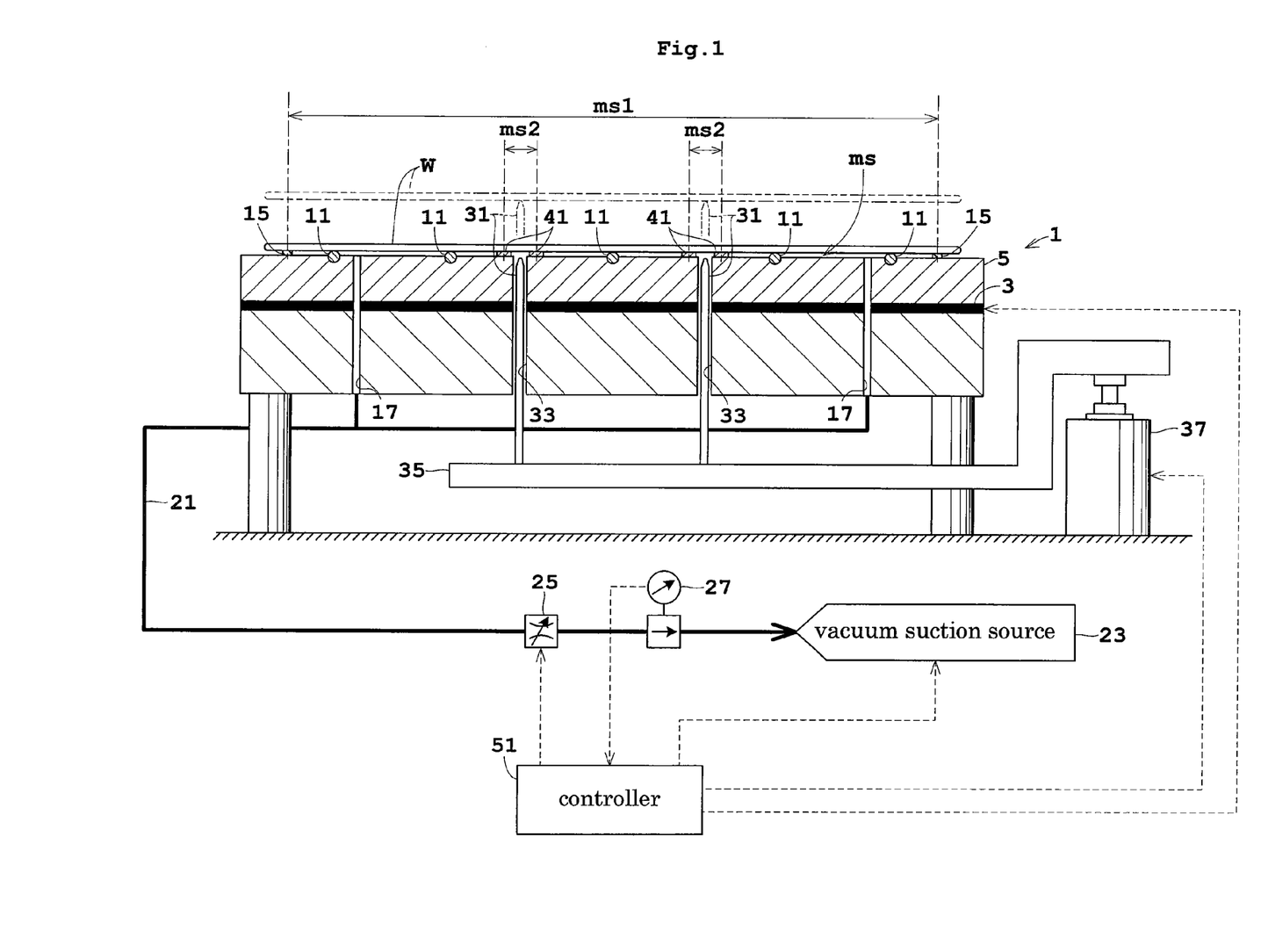
FIG. 1 is a view in vertical section showing an outline of a substrate heat treatment apparatus in Embodiment 1.
Figure 2:
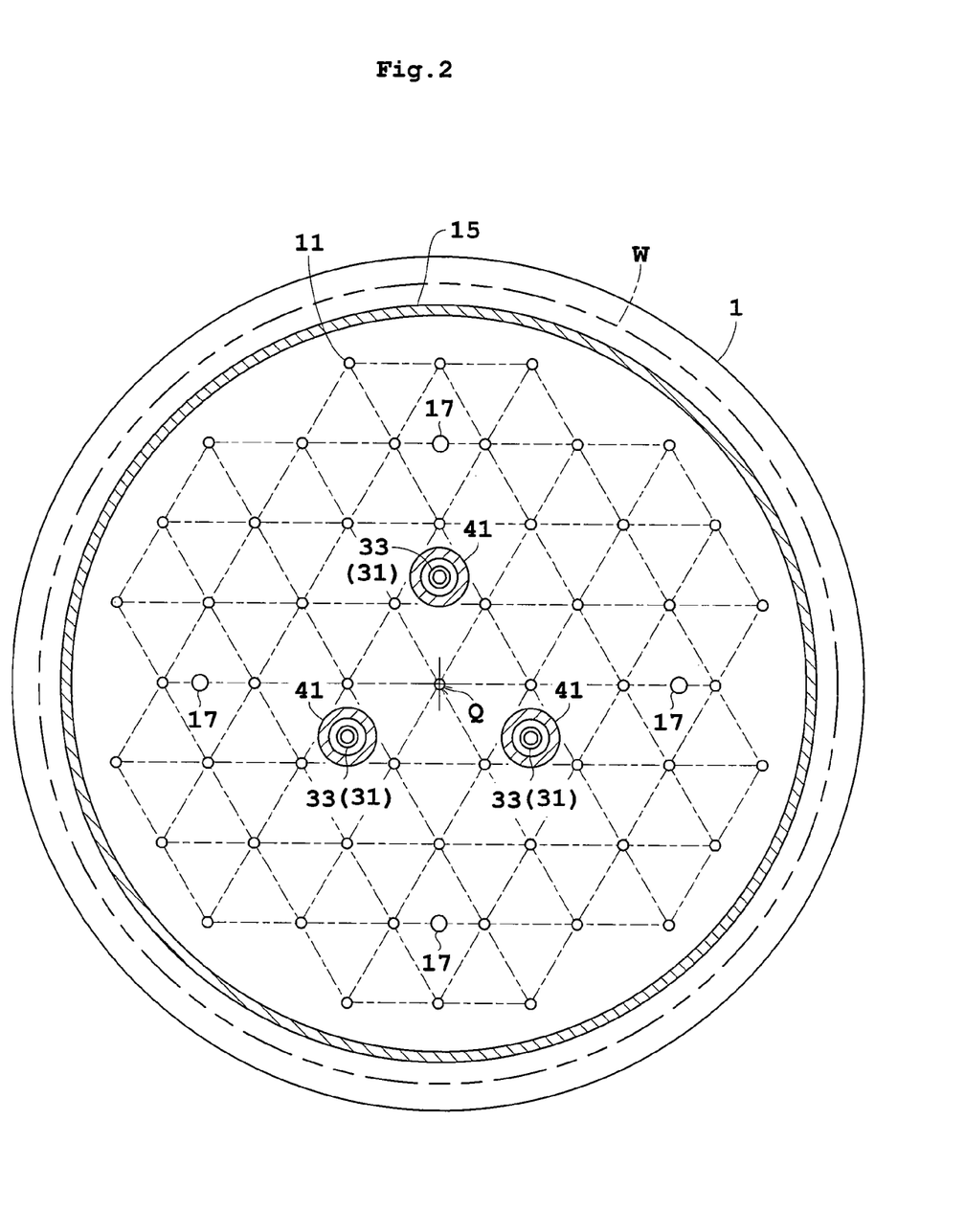
FIG. 2 is a plan view of a heat-treating plate.

FIG. 1 is a view in vertical section showing an outline of a substrate heat treatment apparatus in Embodiment 1. FIG. 2 is a plan view of a heat-treating plate.

A heat-treating plate 1 for supporting a substrate or wafer W under treatment on an upper surface thereof has a heating element 3 such as a mica heater mounted therein. A heat transfer portion 5 between the heating element 3 and the upper surface of heat-treating plate 1 has a plurality of heat pipes, not shown, embedded therein. Cooling grooves, not shown, are formed between the heat pipes for circulating a cooling fluid.

The heat-treating plate 1 has a plurality of support elements 11 arranged on the upper surface thereof for contacting and supporting the lower surface of the wafer W. As shown in FIG. 2, the support elements 11 are arranged regularly on the upper surface of the heat-treating plate 1. In this embodiment, equilateral triangles are assumed to be arranged regularly and continually (in FIG. 2, the equilateral triangles are shown in alternate long and short dash lines). The support elements 11 are located at apexes of these equilateral triangles.

The support elements 11 are spherical, and are formed of ceramics, for example. The heat-treating plate 1 has recesses formed in the upper surfaces thereof, in positions where the support elements 11 are arranged. The support elements 11 are fitted in and fixed to the recesses. The support elements 11 correspond to the support devices in this invention.

The support elements 11 are surrounded by a first sealer 15 for closing lateral areas of a minute space (also called proximity gap) "ms" formed between the heat-treating plate 1 and the wafer W supported by the support elements 11. The minute space "ms" defined by the first sealer 15 will be called hereinafter the first space ms1. In FIG. 1 and other figures, the horizontal range of the first space ms1 is clearly indicated by affixing reference sign "ms1". The first sealer 15 is ring-shaped in plan view, and has an inside diameter slightly smaller than the outside diameter of the wafer W. The first sealer 15 has a height equal to the projecting height of the support elements 11. Thus, the first sealer 15 contacts positions inward of the edges of the wafer W supported by the support elements 11. The first sealer 15, preferably, is formed of polyimide resin which has heat resistance and elasticity, for example. Another usable material is fluororesin. The first sealer 15 corresponds to the first closing device in this invention.

The heat-treating plate 1 further includes transfer pins 31 for contacting and supporting the wafer W and transferring the wafer W to and from a transport device not shown. In this embodiment, the transfer pins 31 are located at the apexes of an equilateral triangle centering on the center of heat-treating plate 1 and clear of the support elements 11 and exhaust bores 17 in plan view. The heat-treating plate 1 has perforations 33 formed to extend vertically therethrough, in positions corresponding to the apexes of the equilateral triangle. The transfer pins 31 are rod-shaped, have a slightly smaller diameter than the perforations 33, and extend through the perforations 33. The transfer pins 31 have lower ends thereof commonly connected to a single support base 35. The support base 35 is connected to a working rod of an air cylinder 37. In other words, the transfer pins 31 and air cylinder 37 are connected to each other through the support base 35. The air cylinder 35 is operable to drive the transfer pins 31 vertically between a transfer position above the projecting height of the support elements 11 and a standby position level with or below the projecting height of the support elements 11. In this embodiment, the standby position is adjacent the upper surface of the heat-treating plate 1. The air cylinder 37 corresponds to the lift device in this invention.

The perforations 33 are not completely closed by the transfer pins 31, but are in communication with the atmosphere at the lower surface of heat-treating plate 1. A second sealer 41 is disposed around an opening of each perforation 33 in the upper surface of heat-treating plate 1. As shown in FIG. 2, the second sealers 41 also are ring-shaped in plan view. The second sealers 41 have an inside diameter slightly larger than the perforations 33, and an outside diameter far smaller than the inside diameter of the first sealer 15. The second sealers 41 surround neither the support elements 11 nor the exhaust bores 17 described hereinafter, apart from the perforations 33.

Figure 3:
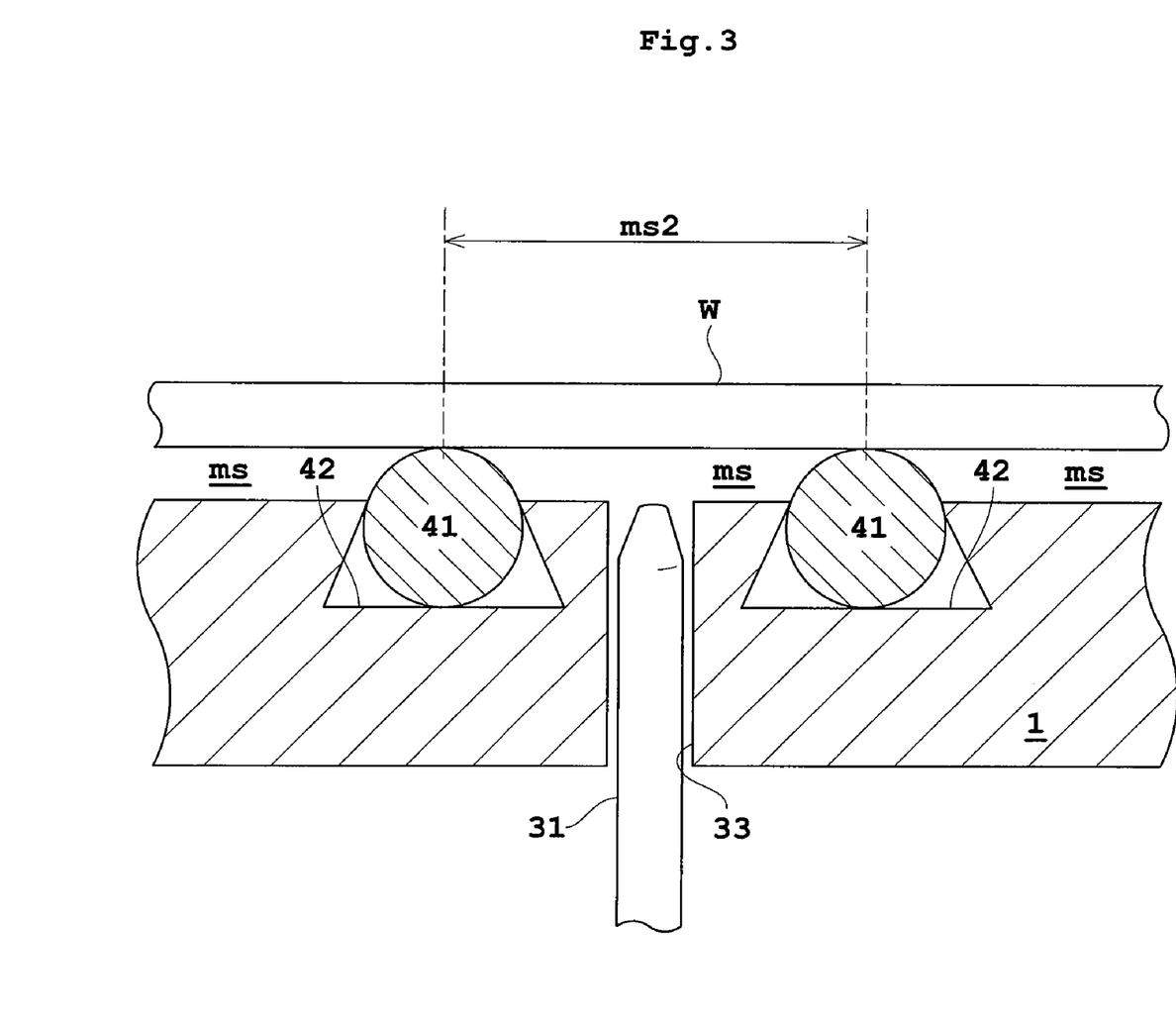
FIG. 3 is an explanatory fragmentary sectional view of a second sealer.

FIG. 3 refers. FIG. 3 is an explanatory fragmentary sectional view of one of the second sealers. The heat-treating plate 1 has ring-like grooves 42 formed in predetermined positions on the upper surface thereof. Each groove 42 has a smaller width in an upper position than in a lower position thereof. In this embodiment, the groove 32 has opposite side surfaces thereof inclined inward toward each other to be broadest at the bottom and progressively narrower toward the top. One of the second sealers 41 is fitted in and fixed to each groove 42 to be retained therein.

Each second sealer 41 is what is called an O-ring formed of an elastic material and having a circular section. The second sealers 41 have a projecting height from the upper surface of heat-treating plate 1, when the wafer W is not drawn by suction, higher by a squeeze margin than the projecting height of the support elements 11. The squeeze margin is set such that, when the wafer W is drawn by suction, the second sealers 41 are compressed and deformed to the same height as the support elements 11. As a result, the second sealers 41 partition the minute space "ms", and close lateral areas of ranges of the minute space "ms" opposed to the perforations 33. The parts of the minute space "ms" opposed to the perforations 33 and partitioned by the second sealers 41 will be referred to hereinafter as second spaces ms2. In FIG. 1 and other figures, the horizontal ranges of the second spaces ms2 are clearly indicated by affixing reference sign "ms2". As a result, the first space ms1 is divided into spaces inside and outside the second sealers 41.

The second sealers 41, preferably, are resistant to heat. The second sealers 41 may be formed of rubber, elastomer, polyimide resin or fluororesin, for example. The second sealers 41 correspond to the second closing devices in this invention.

Further, the heat-treating plate 1 has exhaust bores 17 formed in the upper surface thereof, inwardly of the first sealer 15 and outside the second sealers 41, for exhausting gas. The exhaust bores 17, four in number, are arranged in positions clear of the support elements 11. Each exhaust bore 17 extends down to the lower surface of heat-treating plate 1. One end of exhaust piping 21 is connected commonly to these exhaust bores 17, and a vacuum suction source 23 is connected to the other end of the exhaust piping 21. This vacuum suction source 23 is a vacuum utility provided for a cleanroom, for example. The exhaust piping 21 has a pressure regulating valve 25 for regulating pressure (negative pressure) in the first space ms1, and a pressure gauge 27 for measuring the pressure. The exhaust piping 21 may also have a switch valve with a vacuum breaker. The exhaust piping 21 and vacuum suction source 23 function as an exhaust device.

A controller 51 performs an overall control of the apparatus, i.e. controls output of the heating element 3 noted hereinbefore, switching operation of the pressure regulating valve 25, driving of the vacuum suction source 23, and driving of the air cylinder 37. These controls are performed based on a recipe stored beforehand. The switching operation of the pressure regulating valve 25 is based on results of detection by the pressure gauge 27. The controller 51 is realized by a central processing unit (CPU) which performs various processes, a RAM (Random Access Memory) used as the workspace for operation processes, and a storage medium such as a fixed disk for storing a variety of information.

Figure 4:
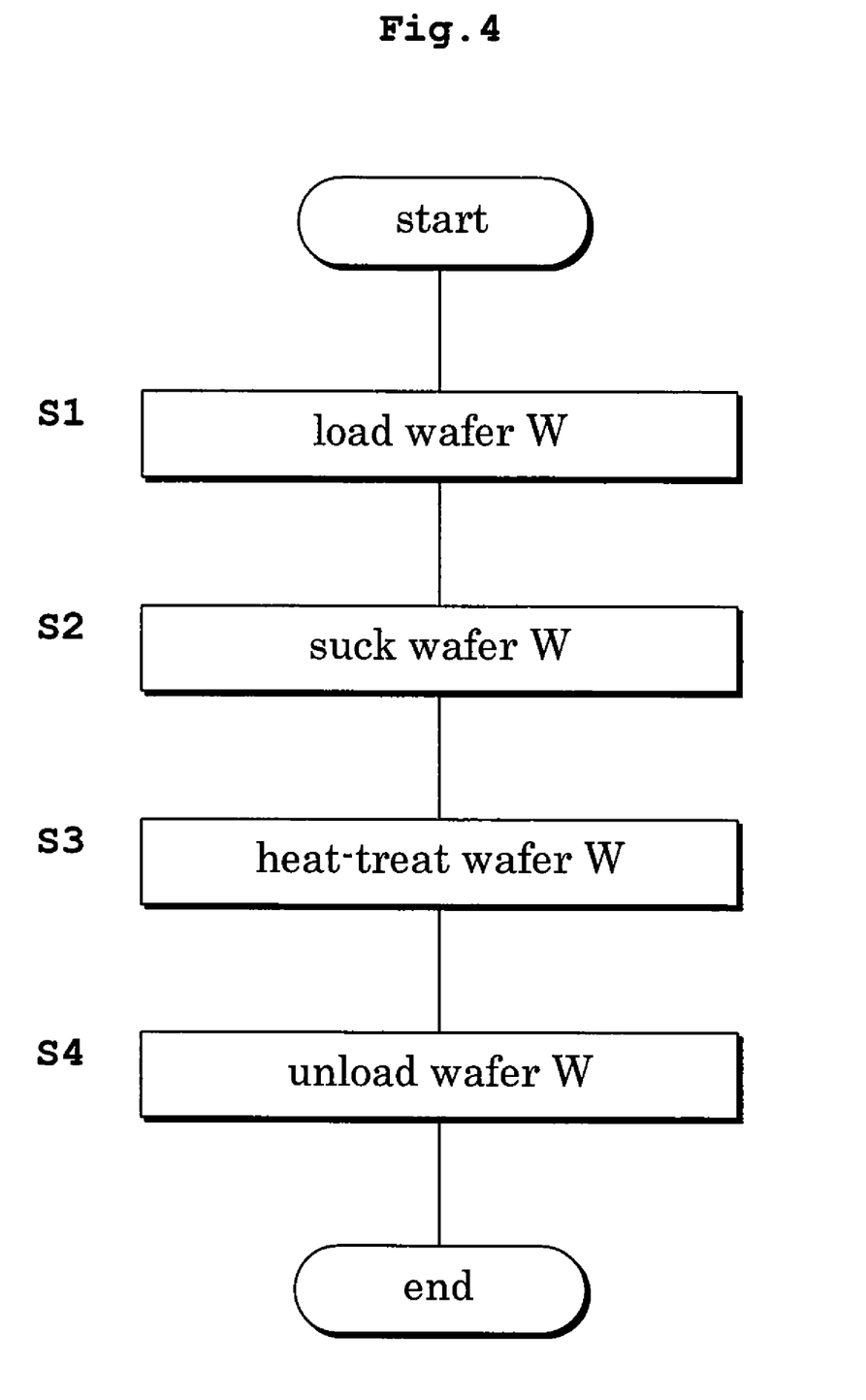
FIG. 4 is a flow chart showing a procedure of treatment by the substrate heat treatment apparatus.

Operation of the substrate heat treatment apparatus having the above construction will be described with reference to FIG. 4. FIG. 4 is a flow chart illustrating a procedure of treatment by the substrate heat treatment apparatus. Temperature control of the heating element 3, for example, is assumed to have already been carried out according to the recipe, and will be omitted from the following description.

<Step S1> Load Wafer W

As the transport device, not shown, loads a wafer W in horizontal posture into the apparatus, the controller 51 operates the air cylinder 37. The air cylinder 37 raises the transfer pins 31 to the transfer position. In the transfer position, the transfer pins 31 receive the wafer W. Subsequently, the air cylinder 37 is reversed to lower the transfer pins 31 to the standby position. At this time, the second sealers 41 first contact the wafer W, and the support elements 11 or the first sealer 15 contact(s) the wafer W next, whereby the wafer W is transferred from the transfer pins 31 to the support elements 11 and sealers 15 and 41. The first space ms1 and second spaces ms2 are formed between the wafer W supported in place and heat-treating plate 1. The lateral areas of the first space ms1 are closed by the first sealer 15. The lateral areas of the second spaces ms2 are closed by the second sealers 41.

<Step S2> Suck Wafer W

The controller 51 drives the vacuum suction source 23, and operates the pressure regulating valve 25. As a result, the gas (i.e. air or nitrogen) in the first space ms1, excluding the second spaces ms2, is exhausted through the exhaust bores 17 and exhaust piping 21, to adjust the internal pressure to a negative pressure. The wafer W is sucked toward the heat-treating plate 1. The second sealers 41 are pressed by the wafer W to be deformed by an amount corresponding to the squeeze margin. At this time, the elastic restoring force of the second sealers 41 produces a contact pressure on surfaces thereof contacting the wafer W, thereby improving the sealing performance of the second sealers 41. Thus, the gastightness of the first space ms1, excluding the second spaces ms2, is never impaired through the perforations 33.

A curvature of wafer W, if any, is corrected to follow the support elements 11 and first and second sealers 15 and 41. Even when the first and second sealers 15 and 41 fail to close the lateral areas of the first and second spaces ms1 and ms2 completely before the wafer W is sucked, this step S2 can secure gastightness of the first space ms1 excluding the second spaces ms2.

Figure 5A:
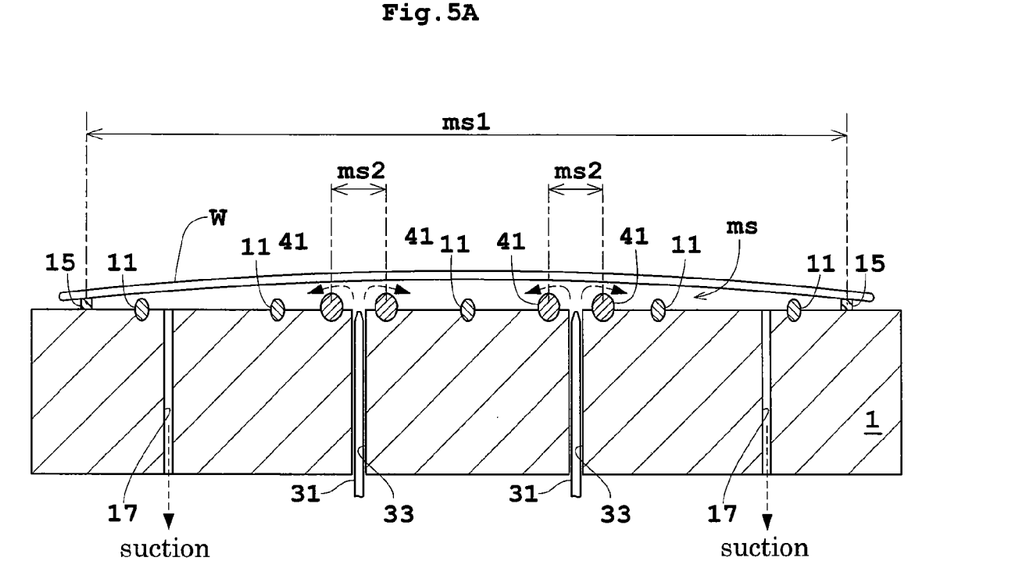
FIG. 5A is an explanatory view showing treatment of a curved substrate with a central portion thereof bulging away from the heat-treating plate.
Figure 5B:
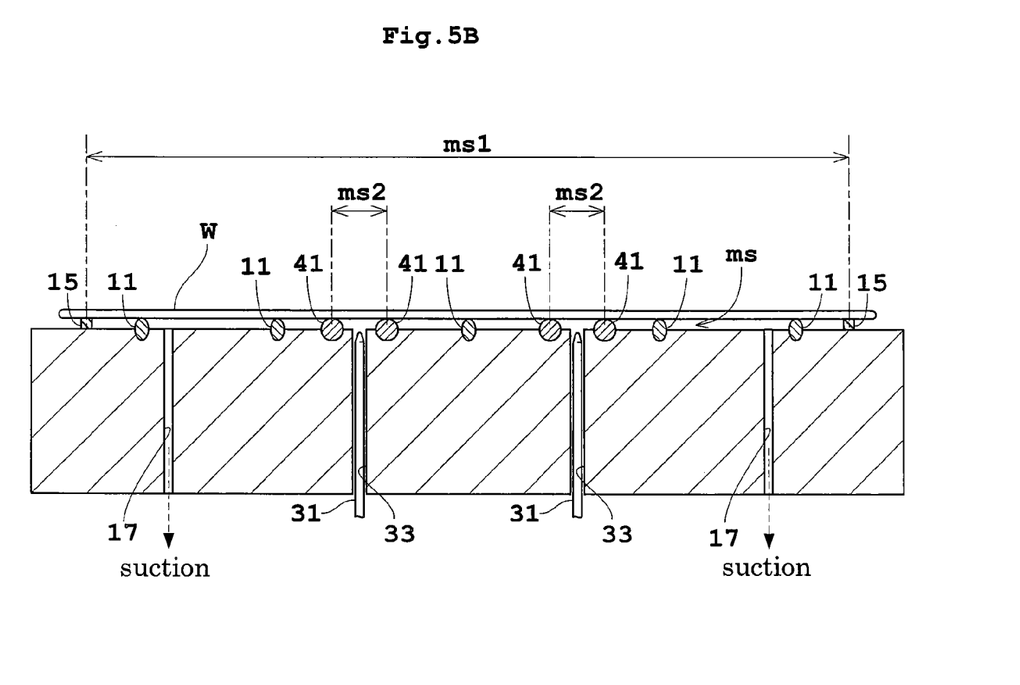
FIG. 5B is an explanatory view showing treatment of the curved substrate with the central portion bulging away from the heat-treating plate.
Figure 6A:
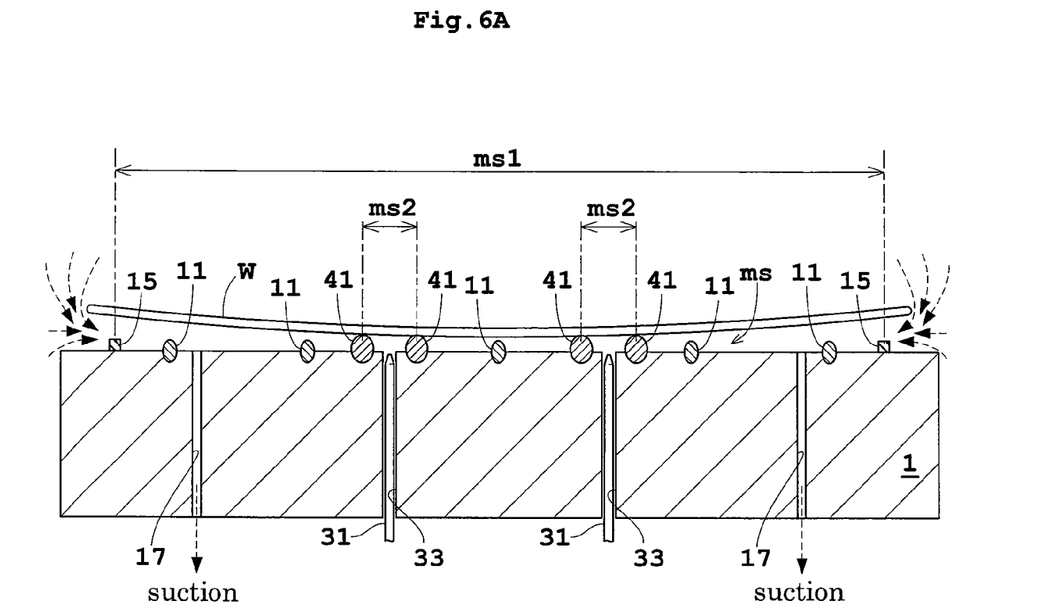
FIG. 6A is an explanatory view showing treatment of a curved substrate with a central portion thereof bulging toward the heat-treating plate.

This process will particularly be described with reference to FIGS. 5A, 5B, 6A and 6B. The curvature of wafer W includes a case where, as shown in FIG. 5A, the wafer W is curved to have the central part bulging upward (dome-like curvature), and a case where, as shown in FIG. 6A, the wafer W is curved to have the central part bulging downward (bowl-like curvature).

When the wafer W with the central part bulging upward is in place, the first sealer 15 is already in contact with the wafer W but the second sealers 41 are not. Thus, the lateral areas of the first space ms1 are closed, but the lateral areas of the second spaces ms2 are not. The first space ms1 is communication with the atmosphere through the perforations 33, and is not gastight. However, the suction applied in this state will cause gas to flow over the second sealers 41 from inside to outside the second sealers 41, producing Bernoulli effect to draw downward the parts of the wafer W opposed to the second sealers 41 (FIG. 5A shows air flows in dotted lines). The wafer W will soon contact the second sealers 41 to close the lateral areas of the second sealers 41 to render gastight the first space ms1 excluding the second spaces ms2. With a further application of suction, the wafer W as a whole is drawn downward, whereby the curvature of wafer W is corrected to be substantially level as shown in FIG. 5B.

Figure 6B:
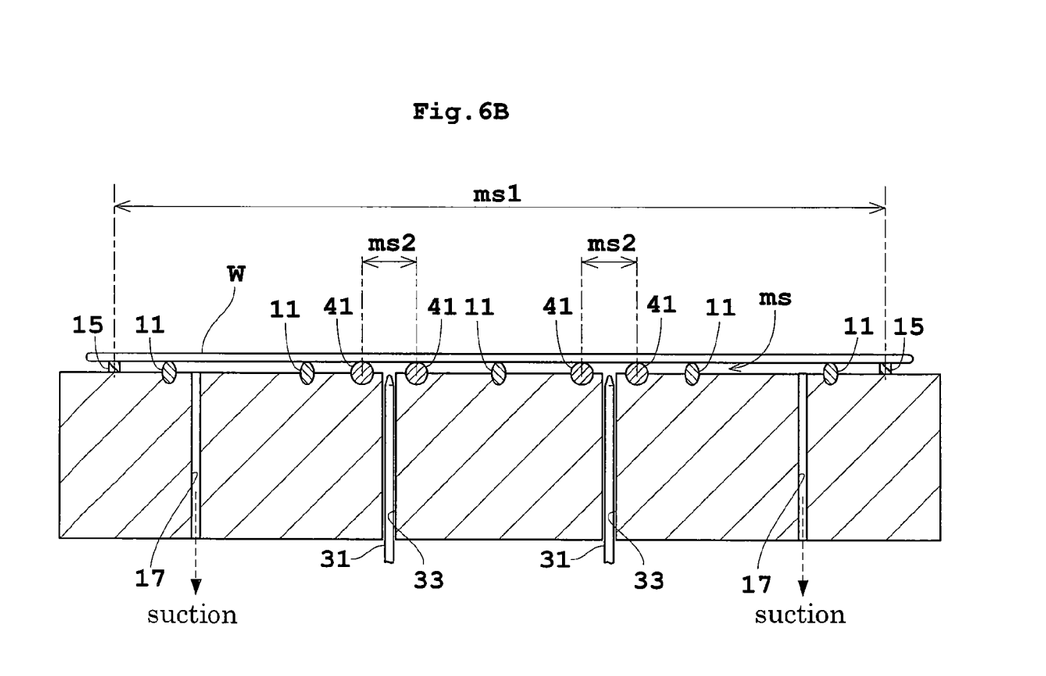
FIG. 6B is an explanatory view showing the treatment of the curved substrate with the central portion bulging toward the heat-treating plate.

On the other hand, when the wafer W with the central part bulging downward is in place, the first sealer 15 is out of contact with the wafer W but the second sealers 41 are in contact with the wafer Wt. Thus, only the lateral areas of the second spaces ms2 are closed, and the lateral areas of the first space ms1 are open. However, the suction applied in this state will cause gas to flow from the ambient through the gap between the wafer W and first sealer 15 into the first space ms1, producing Bernoulli effect to draw the edge regions of wafer W downward (FIG. 6A shows air flows in doted lines). The edge regions of wafer W will soon contact the first sealer 15 to close the lateral areas of the first space ms1 to render gastight the first space ms1 excluding the second spaces ms2. The curvature of wafer W is corrected to be substantially level as shown in FIG. 6B.

<Step S3> Heat-Treat Wafer W

A predetermined heat treatment is carried out for the wafer W while maintaining the wafer W in the suction-supported state for a predetermined time.

<Step S4> Unload Wafer W

Upon completion of the heat treatment performed for the predetermined time, the controller 51 stops the vacuum suction source 23 and closes the pressure regulating valve 25, to stop the gas exhaustion from the first space ms1 excluding the second spaces ms2 and return the internal pressure to atmospheric pressure. As a result, the wafer W is released from suction. Subsequently, the air cylinder 37 is driven to raise the transfer pins 31 and wafer W. In this state, the transport device, not shown, unloads the wafer W from the apparatus.

According to the substrate heat treatment apparatus in Embodiment 1, as described above, the second sealers 41 close the lateral areas of the second spaces ms2 to seal off the first space ms1. Consequently, the gastightness of the first space ms1, excluding the second spaces ms2, is never impaired through the perforations 33. Thus, the wafer W can be sucked properly, and even a curved wafer W can be corrected to a flat state. The wafer W is heat-treated effectively.

The second sealers 41, while being deformed by an amount corresponding to the squeeze margin, are placed in contact with the wafer W. The elastic restoring force of the second sealers 41 produces a contact pressure on the surfaces thereof contacting the wafer W, which improves the sealing performance of the second sealers 41.

The second sealers 41 are fixed in place only to contact to the wafer W, without sliding relative to other components. This realizes a very simple structure, and has no possibility of producing particles or the like. Since the communication with the perforations 33 is broken only by these second sealers 41, the apparatus is manufactured at low cost.

Embodiment 2

Figure 7:
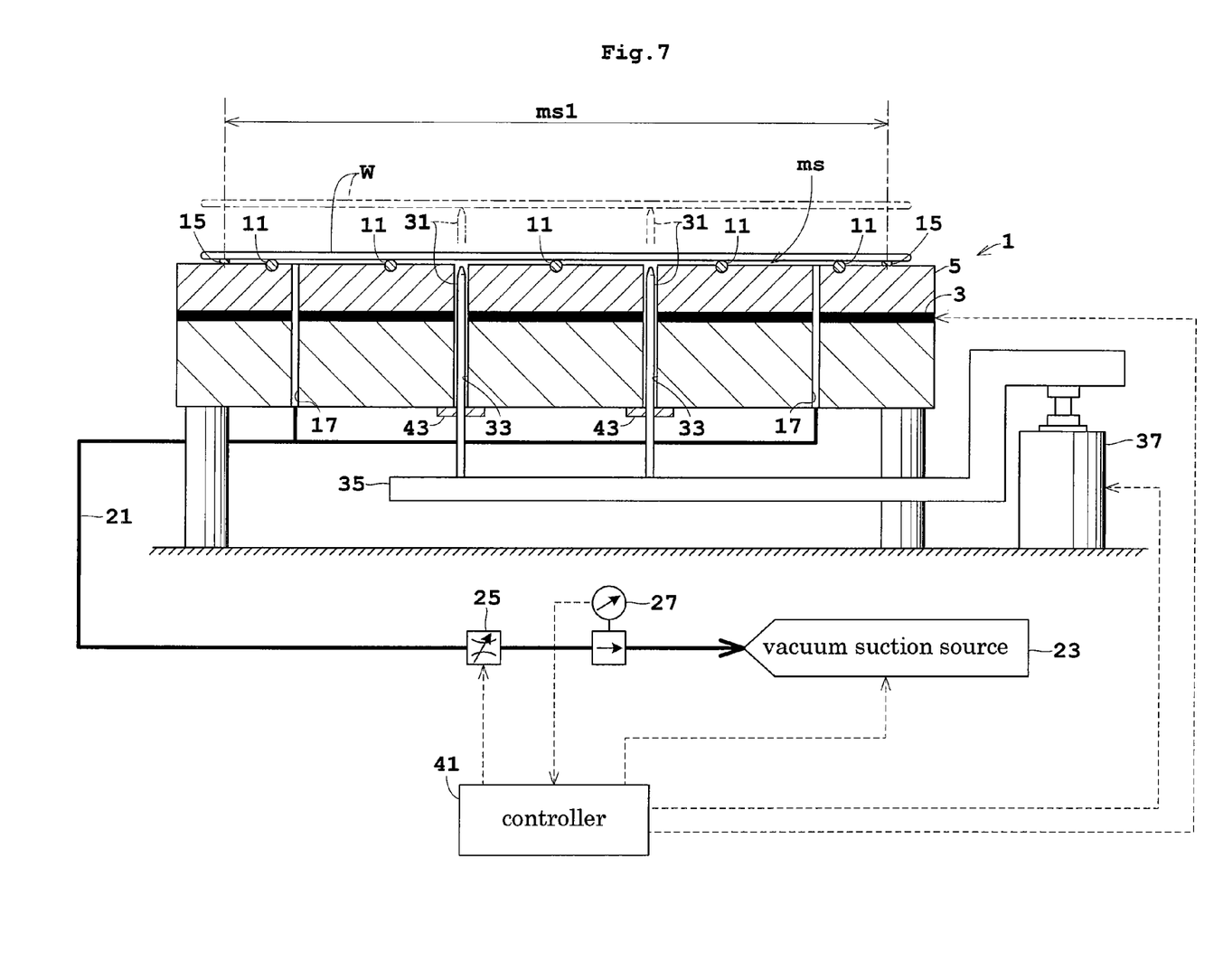
FIG. 7 is a view in vertical section showing an outline of a substrate heat treatment apparatus in Embodiment 2.

Embodiment 2 of this invention will be described hereinafter with reference to FIG. 7. Like reference numerals are used to identify like parts which are the same as in Embodiment 1 and will not particularly be described. FIG. 7 is a view in vertical section showing an outline of a substrate heat treatment apparatus in Embodiment 2.

Embodiment 2 is directed to a substrate heat treatment apparatus having slide contact elements 43 in place of the second sealers 41 in Embodiment 1. The slide contact elements 43 are provided for the openings of the perforations 33 in the lower surface of heat-treating plate 1. The slide contact elements 43 are ring-shaped, and have an inside diameter corresponding to the outside diameter of transfer pins 31. The transfer pins 31 slidably extend through the center openings of the slide contact elements 43, respectively. Thus, the slide contact elements 43 close the perforations 33 (i.e. apply shaft seals) while being in sliding contact with the transfer pins 31 without obstructing movement of the latter. The slide contact elements 43 are formed of rubber, for example. The first sealer 15 corresponds to the first closing device in this invention, and to the closing device in this invention.

When a wafer W is loaded into the substrate heat treatment apparatus having the above construction, the transfer pins 31 are vertically moved with peripheral surfaces thereof in close sliding contact with inner peripheral surfaces of the slide contact elements 43. Thus, the slide contact elements 43 constantly maintain the perforations 33 out of communication with the atmosphere. When the wafer W is transferred onto the support elements 11, the first sealer 15 will close the lateral areas of the first space ms1 to seal the first space ms1. Subsequently the wafer W can be sucked effectively.

Thus, according to Embodiment 2, the slide contact elements 43 are effective to prevent impairment of the gastightness of the first space ms1 through the perforations 33. Since the slide contact elements 43 are arranged on the lower surface of heat-treating plate 1 remote from the wafer W, particles generating from the slide contact elements 43, if any, can hardly reach the wafer W.

Embodiment 3

Figure 8:
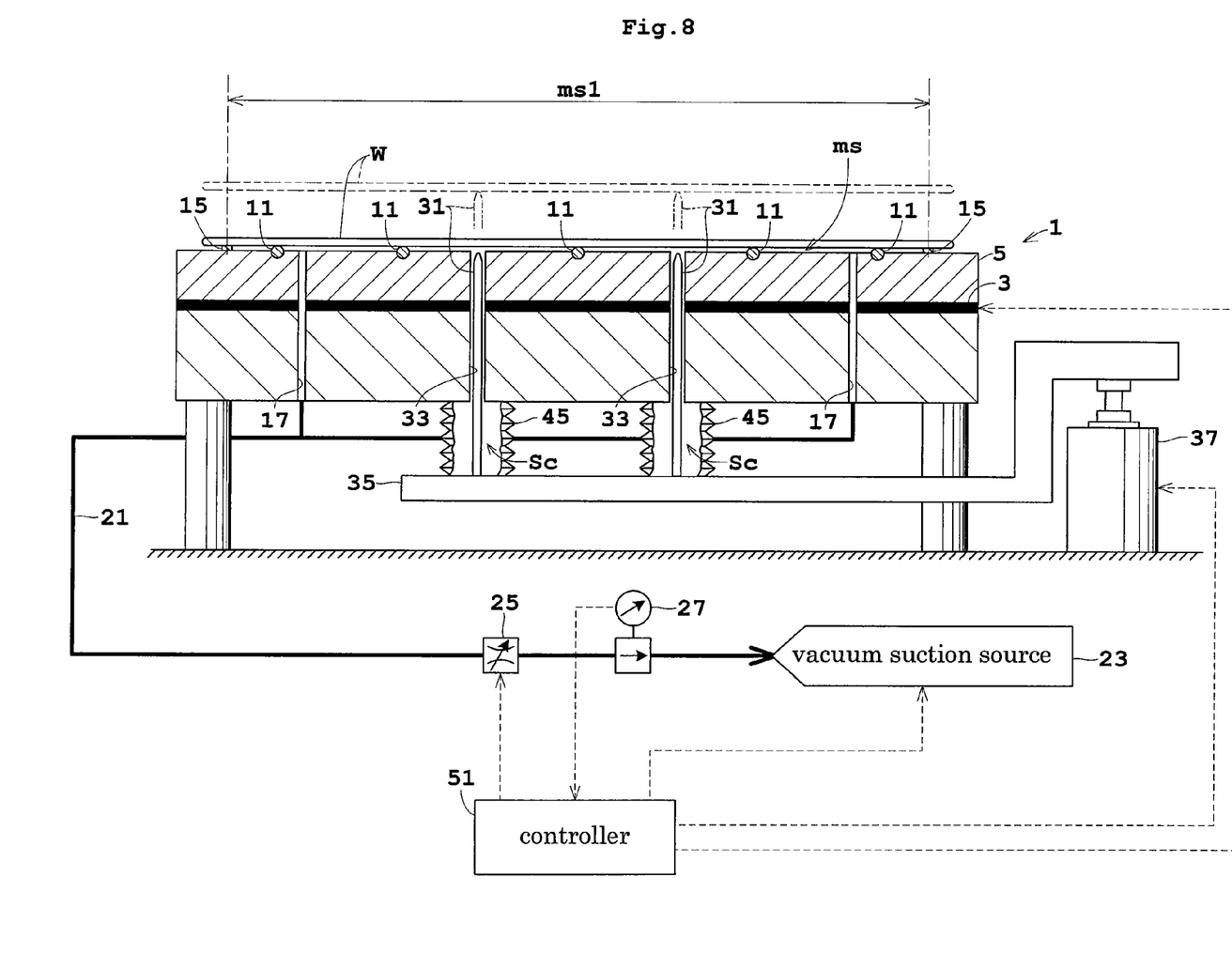
FIG. 8 is a view in vertical section showing an outline of a substrate heat treatment apparatus in Embodiment 3.

Embodiment 3 of this invention will be described hereinafter with reference to FIG. 8. Like reference numerals are used to identify like parts which are the same as in Embodiment 1 and will not particularly be described. FIG. 8 is a view in vertical section showing an outline of a substrate heat treatment apparatus in Embodiment 3.

Embodiment 3 is directed to a substrate heat treatment apparatus having flexion elements 45 in place of the second sealers 41 in Embodiment 1. The flexion elements 45 are in the form of bellows-like tubes vertically expandable and contractible. The flexion elements 45 have upper ends thereof secured to positions surrounding the openings of the perforations 33 in the lower surface of heat-treating plate 1. The lower ends of the flexion elements 45 are secured to the support base 35 to surround the transfer pins 31. The flexion elements 45 define closed spaces Sc therein communicating with the perforations 33, respectively.

When a wafer W is loaded into the substrate heat treatment apparatus having the above construction, the air cylinder 37 moves the support base 35 and transfer pins 31 vertically. With the vertical movement of the transfer pins 31, the flexion elements 45 expand and contract vertically while isolating the inner closed spaces Sc from the ambient. Thus, the flexion elements 45 constantly maintain the perforations 33 out of communication with the atmosphere. When the wafer W is transferred onto the support elements 11, the first sealer 15 will close the lateral areas of the first space ms1 to render the first space ms1 gastight. Subsequently the wafer W can be sucked effectively.

Thus, according to Embodiment 3, the flexion elements 45 are effective to prevent impairment of the gastightness of the first space ms1 through the perforations 33. Since the flexion elements 45 are not in sliding contact with other components, there is little chance of producing particles. The flexion elements 45 having the lower ends attached to the support base 35 can define the closed space Sc inside.

This invention is not limited to the foregoing embodiments, but may be modified as follows:

(1) In Embodiment 1 described hereinbefore, the second sealers 41 are exemplified by elastic O-rings, but this is not limitative. For example, each entire second sealer 41 need not be elastic, but may include an elastic part. Specifically, each second sealer may have springs to make the second sealer elastic.

Figure 9:
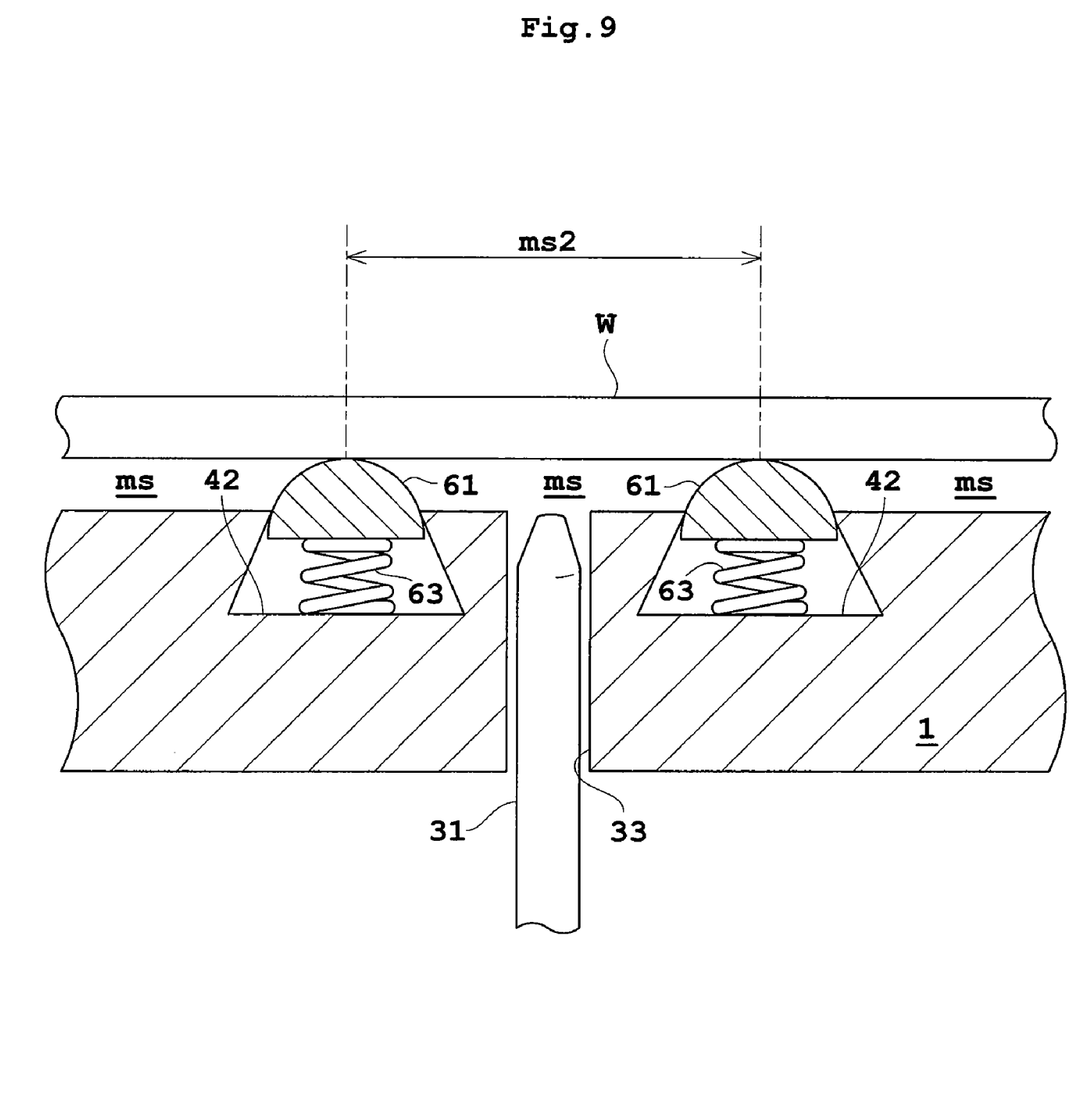
FIG. 9 is an explanatory fragmentary sectional view of a second sealer in a modified embodiment.

This construction will particularly be described with reference to FIG. 9. As shown, each second sealer may be modified to include a head 61 and springs 63. The head 61 is ring-shaped in plan view, and semicircular in sectional view. The head 61 may be formed of rubber, elastomer, polyimide resin or fluororesin, for example. Two or more springs 63 are arranged on the lower surface of the head 61 to be expandable and contractible vertically relative to the upper surface of heat-treating plate 1, respectively Such modified second sealers can also close the lateral regions of the second spaces ms2 effectively.

The second sealers 41 may be changed to inelastic elements. Even in this case, the second spaces ms2 can be closed by the second sealers contacting the wafer W. In this case, the projecting height of second sealers 41 above the upper surface of heat-treating plate 1 may be set equal to the projecting height of the support elements 11 in time of normal conditions.

The second sealers 41 are not limited to O-rings. As long as the second sealers are ring-like, the shape is not limited to circular but may be rectangular, for example. Their section is not limited to circular, either, but may be rectangular.

(2) In Embodiment 1 described hereinbefore, the grooves 42 are formed in the heat-treating plate 1 for arranging the second sealers 41. Such grooves are not essential. For example, it is unnecessary to work the heat-treating plate 1 only if the second sealers 41 can be attached fixedly to the upper surface of heat-treating plate 1.

(3) In Embodiment 1 described hereinbefore, the second sealers 41 also serve to support the wafer W. It is therefore possible to dispense with support elements 11 arranged adjacent the second sealers 41.

(4) In Embodiment 2 described hereinbefore, the slide contact elements 43 are arranged at the lower ends of perforations 33. Such location is not limitative. For example, the slide contact elements 43 may be provided for the openings at the upper ends of perforation 33 (on the upper surface of heat-treating plate 1), or in intermediate positions of perforation 33 (in the interior of heat-treating plate 1).

(5) In Embodiment 2 described hereinbefore, the slide contact elements 43 are exemplified by rubber. Their material is not limited to rubber. For example, magnetic fluid seals may be used as shaft seals. That is, a magnetic fluid may be provided peripherally of the transfer pins 31 as hermetic seal material, which is placed in tight contact with the transfer pins 31 by magnetic force, to isolate the perforations 33 from the atmosphere. This is effective to suppress generation of particles.

Further, O-rings may be used as the slide contact elements 43. For example, one or more grooves may be formed in the inner wall of each perforation 33, and one or more O-rings having an inside diameter corresponding to the outside diameter of transfer pin 31 may be fixedly mounted in the groove or grooves, and penetrated by the transfer pin 31.

(6) In Embodiments 2 and 3 described hereinbefore, the perforations 33 and exhaust bores 17 are formed separately This is not limitative. For example, exhaust channels may be formed inside the transfer pins 31, and connected to the series of exhaust devices. Thus, the transfer pins 31 are given functions equivalent to the exhaust bores 17. Alternatively, gas may be exhausted from the first space ms1 by using the gaps between the transfer pins 31 and perforations 33. Such modifications can dispense with the exhaust bores 17.

(7) In Embodiment 3 described hereinbefore, the lower ends of flexion elements 45 are attached to the support base 35. The invention is not limited to this installation method. As long as the closed spaces Sc communicating with the perforations 33 are isolated from the ambient, the lower ends of flexion elements 45 may be attached to the transfer pins 31 or other components.

(8) In each embodiment described hereinbefore, the wafer W is circular, but this is not limitative. The first sealer 15 is annular in plan view, but may be shaped otherwise as long as it is ring-like. For example, the substrates to be treated may be rectangular, and the first sealer 15 may be rectangular.

(9) In each embodiment described hereinbefore, the support elements 11 are spherical, and are formed of ceramics. For example, any other suitable shape may be employed as long as the support elements project from the upper surface of heat-treating plate 1. The material of the support elements 11 may be changed to a resin or the like.

(10) In each embodiment described hereinbefore, heat pipes are embedded in the heat transfer portion 5. The invention is applicable also to a substrate heat treatment apparatus having no heat pipes.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate heat treatment apparatus for heat-treating a substrate, comprising:
    a heat-treating plate;
    transfer pins mounted in perforations extending vertically through said heat-treating plate for contacting and supporting the substrate;
    support devices projecting from an upper surface of said heat-treating plate for contacting and supporting the substrate;
    a lift device for vertically moving said transfer pins between a transfer position above a projecting height of said support devices and a standby position level with or below the projecting height of said support devices;
    a first closing device disposed annularly on the upper surface of said heat-treating plate for closing lateral areas of a first space formed between the substrate supported by said support devices and said heat-treating plate;
    second closing devices disposed annularly on the upper surface of said heat-treating plate, around openings of said perforations, and in positions inward of said first closing device, for closing lateral areas of second spaces formed between the substrate supported by said support devices and said heat-treating plate, said second spaces being opposed to said perforations; and
    exhaust bores for exhausting gas from said first space excluding said second spaces.

2. An apparatus as defined in claim 1, wherein said second closing devices have elastic elements.

3. An apparatus as defined in claim 1, wherein each of said second closing devices has a squeeze margin at a height corresponding to said support devices.

4. An apparatus as defined in claim 2, wherein said elastic elements are springs.

5. An apparatus as defined in claim 1, wherein said second closing devices are resistant to heat.

6. An apparatus as defined in claim 1, wherein said second closing devices are formed of one of rubber, elastomer, polyimide resin and fluororesin.

7. An apparatus as defined in claim 1, wherein said second closing devices are O-rings.

8. An apparatus as defined in claim 1, wherein said heat-treating plate has grooves formed in the upper surface thereof for receiving said second closing devices.

9. An apparatus as defined in claim 8, wherein each of said grooves has a smaller width in an upper position than in a lower position thereof to retain one of the second closing devices fitted therein.

10. An apparatus as defined in claim 1, wherein said exhaust bores are formed in the upper surface of said heat-treating plate.

11. A substrate heat treatment apparatus for heat-treating a substrate, comprising:
 a heat-treating plate;
 transfer pins mounted in perforations extending vertically through said heat-treating plate for contacting and supporting the substrate;
 support devices projecting from an upper surface of said heat-treating plate for contacting and supporting the substrate;
 a lift device for vertically moving said transfer pins between a transfer position above a projecting height of said support devices and a standby position level with or below the projecting height of said support devices;
 a closing device disposed annularly on the upper surface of said heat-treating plate for closing lateral areas of a space formed between the substrate supported by said support devices and said heat-treating plate;
 exhaust bores for exhausting gas from said space excluding said second spaces; and
 ring-shaped slide contact elements provided for said perforations and in sliding contact with said transfer pins for applying shaft seals thereto.

12. An apparatus as defined in claim 11, wherein said slide contact elements are arranged around openings of said perforations formed in a lower surface of said heat-treating plate.

13. An apparatus as defined in claim 11, wherein said slide contact elements are formed of rubber.

14. An apparatus as defined in claim 11, wherein said slide contact elements are O-rings.

15. An apparatus as defined in claim 11, wherein said slide contact elements are in form of magnetic fluid seals.

16. An apparatus as defined in claim 11, wherein said exhaust bores are formed in the upper surface of said heat-treating plate.

17. A substrate heat treatment apparatus for heat-treating a substrate, comprising:
 a heat-treating plate;
 transfer pins mounted in perforations extending vertically through said heat-treating plate for contacting and supporting the substrate;
 support devices projecting from an upper surface of said heat-treating plate for contacting and supporting the substrate;
 a lift device for vertically moving said transfer pins between a transfer position above a projecting height of said support devices and a standby position level with or below the projecting height of said support devices;
 a closing device disposed annularly on the upper surface of said heat-treating plate for closing lateral areas of a space formed between the substrate supported by said support devices and said heat-treating plate;
 exhaust bores for exhausting gas from said space; and
 flexion elements joined to positions on a lower surface of said heat-treating plate and surrounding openings of said perforations, and defining closed spaces communicating with said perforations, said flexion elements being expandable and contractible with vertical movement of said transfer pins.

18. An apparatus as defined in claim 17, wherein:
 said transfer pins and said lift device are connected to each other through a support base; and
 said flexion elements surround said transfer pins and are joined to said support base.

19. An apparatus as defined in claim 17, wherein said flexion elements are tubular bellows-like elements.

20. An apparatus as defined in claim 17, wherein said exhaust bores are formed in the upper surface of said heat-treating plate.

* * * * *